United States Patent [19]

Lee et al.

[11] Patent Number: 5,248,969
[45] Date of Patent: Sep. 28, 1993

[54] PHASE COMPARING AND CMI/NRZ DECODING APPARATUS

[75] Inventors: Bhum C. Lee; Jung S. Kim, both of Dong; Kwon C. Park, Yuseong, all of Rep. of Korea

[73] Assignees: Electronics and Telecommunications Research Institute, Rep. of Korea; Korea Telecommunication Authority, Rep. of Korea

[21] Appl. No.: 915,115

[22] Filed: Jul. 17, 1992

[30] Foreign Application Priority Data

Jul. 19, 1991 [KR] Rep. of Korea ............... 1991-12427

[51] Int. Cl.[5] .............................................. H03M 5/14
[52] U.S. Cl. ......................................... 341/73; 341/68
[58] Field of Search .................................... 341/68, 73

[56] References Cited

U.S. PATENT DOCUMENTS

| | | | |
|---|---|---|---|
| 4,325,053 | 4/1982 | Le Brozec et al. | 341/73 |
| 4,400,667 | 8/1983 | Belkin | 331/1 A |
| 4,422,176 | 11/1983 | Summers | 375/120 |
| 4,562,422 | 12/1985 | Pospischil | 341/73 |
| 4,873,524 | 10/1989 | Akkermans | 341/73 |
| 5,038,351 | 8/1991 | Sakai et al. | 371/47.1 |
| 5,056,118 | 10/1991 | Sun | 375/106 |
| 5,107,263 | 4/1992 | Kim et al. | 341/73 |

*Primary Examiner*—Marc S. Hoff
*Attorney, Agent, or Firm*—Blakely, Sokoloff, Taylor & Zafman

[57] ABSTRACT

A phase comparing and CMI/NRZ decoding apparatus for accomplishing bit synchronization of CMI data by producing rising transition or falling transition of the clock pulse at the center of unit bit interval of incoming CMI data, by use of the clock pulse having a period equivalent to 2 unit bit intervals of CMI data, and for realizing stable decoding of CMI data to NRZ data. This apparatus is implemented by means of a data output means 2, a clock pulse generating means 1 for generating in-phase and inverse-phase pulses, a inter-transitions time interval information output means 3 for outputting information about line interval between the data transition and the clock pulse transition, a reference pulse generating means 4, a falling transition detecting and 3-step half-period shifting means 6, a rising transition detecting and 2-step half-period shifting means 5, a CMI/NRZ decoding circuit 7 and a code violation detecting means 8.

9 Claims, 9 Drawing Sheets

PHASE COMPARING AND CMI/NRZ DECODING APPARATUS

TECHNICAL FIELD

The present invention relates a phase comparing and CMI/NRZ decoding apparatus for bit synchronizing CMI data and decoding the CMI (Code Mark Inversion) data to NRZ(Non-Return to Zero) data.

BACKGROUND OF THE INVENTION

A conventional CMI data synchronizing circuit decodes the CMI data to the NRZ data by means of an open loop retiming circuit wherein the transition of a clock pulse extracted from data is manually adjusted to be produced at the center of the unit bit interval of the CMI data. As a result, the transition of the clock pulse extracted from the CMI data can not be produced automatically at the center of the unit interval of the CMI data. Also, in decoding the CMI data to the NRZ data by use of the clock pulse extracted from the CMI data, because the phases of rising or falling transitions of the extracted clock pulse should be always constant relative to the transition of the CMI data, a phase margin of the extracted clock pulse is within 180 degrees. Accordingly, for retiming the data, a accurate phase compensation circuit is required. However, because a conventional CMI/NRZ decoding and retiming circuit largely depends upon the accuracy and the temperature characteristics of the constituting elements, several problems are caused. In addition, in the case of utilizing the recently developed self-adjusting retiming circuit wherein bit syncronization of the CMI data is implemented by mean of a clock pulse produced by VCO(-Voltage Controlled Oscillator), it is disadvantageous that the period of the clock pulse used should be equivalent to the unit bit interval of the CMI data.

SUMMARY OF THE INVENTION

Therefore, an object of the invention is to solve the problems encountered in the above-mentioned prior art, and to provide a phase comparing and CMI/NRZ decoding apparatus for accomplishing the bit syncronization of the CMI data by producing the rising transition or falling transition of the clock pulse at the center of the unit bit interval(UI) of the input CMI data, by use of the clock pulse having a period equivalent to 2 unit bit intervals of the CMI data, namely, the clock pulse having a frequency equivalent to ½ maximum bit rate of the CMI data, and for realizing the stable decoding of the CMI data to the NRZ data, although the phase of the clock pulse changes by 180 degrees relative to the phase of the CMI data.

To achieve the object of the invention, a phase comparing and CMI/NRZ decoding apparatus according to the invention comprises: a clock pulse generating means for generating in-phase and inverse-phase clock pulses compared with the clock pulse produced by a VCO or a phase control circuit; a data output means for outputting inverting data and non-inverting data relative with the input CMI data; a inter-transitions time interval information output means, connected to the clock pulse generating means and the data output means, for outputting information about the relations of the phase of the transition of the clock pulse with the phase of the center of the unit bit interval (UI) of the CMI data and for outputting information about the presence or not of transition occurrence in the CMI data; a reference pulse generating means, connected to the clock pulse generating means and the inter-transitions time interval information output means, for producing a pulse being triggered by rising transition or falling transition of the clock pulse from the clock pulse generating means in the case of occurring of the rising transition in the input CMI data and having a pulse width equivalent to ½ clock pulse period; a rising transition detecting and 2-step half-period shifting means connected to the clock pulse generating means and the reference pulse generating means, and upon occuring of the rising transition in the CMI data, outputting a pulse being delayed twice in sequence by ½ clock pulse period relative to the output of the reference pulse generating means and having a pulse width equivalent to a half of the clock pulse period; a falling transition detecting and 3-step half-period shifting means connected to the clock pulse generating means and the inter-transitions time interval information output means and, upon occurring of the falling transition in the CMI data, outputting a pulse being delayed three times in sequence by a half of the clock pulse relative to the falling transition of a pulse by the inter-transitions time interval information output means and having a pulse width equivalent to a half of the clock pulse period; a CMI/NRZ decoding means, connected to the clock pulse generating means and the falling transition detecting and 3-step half-period shifting means, for decoding the CMI data to the NRZ data; and a code violation detecting means for detecting code violations in the CMI data, which is connected to the clock pulse generating means, the reference pulse generating means, the rising transition detecting and 2-step half-period shifting means, and the falling transition detecting and 3-step half-period shifting means.

BRIEF DISCRIPTION OF THE INVENTION

This invention will be further understood from the following discription with reference to the accompanying drawings, in which FIG. 1 is a schematic block diagram of an embodiment of an phase comparing and CMI/NRZ decoding apparatus according to the invention.

Figure 2:
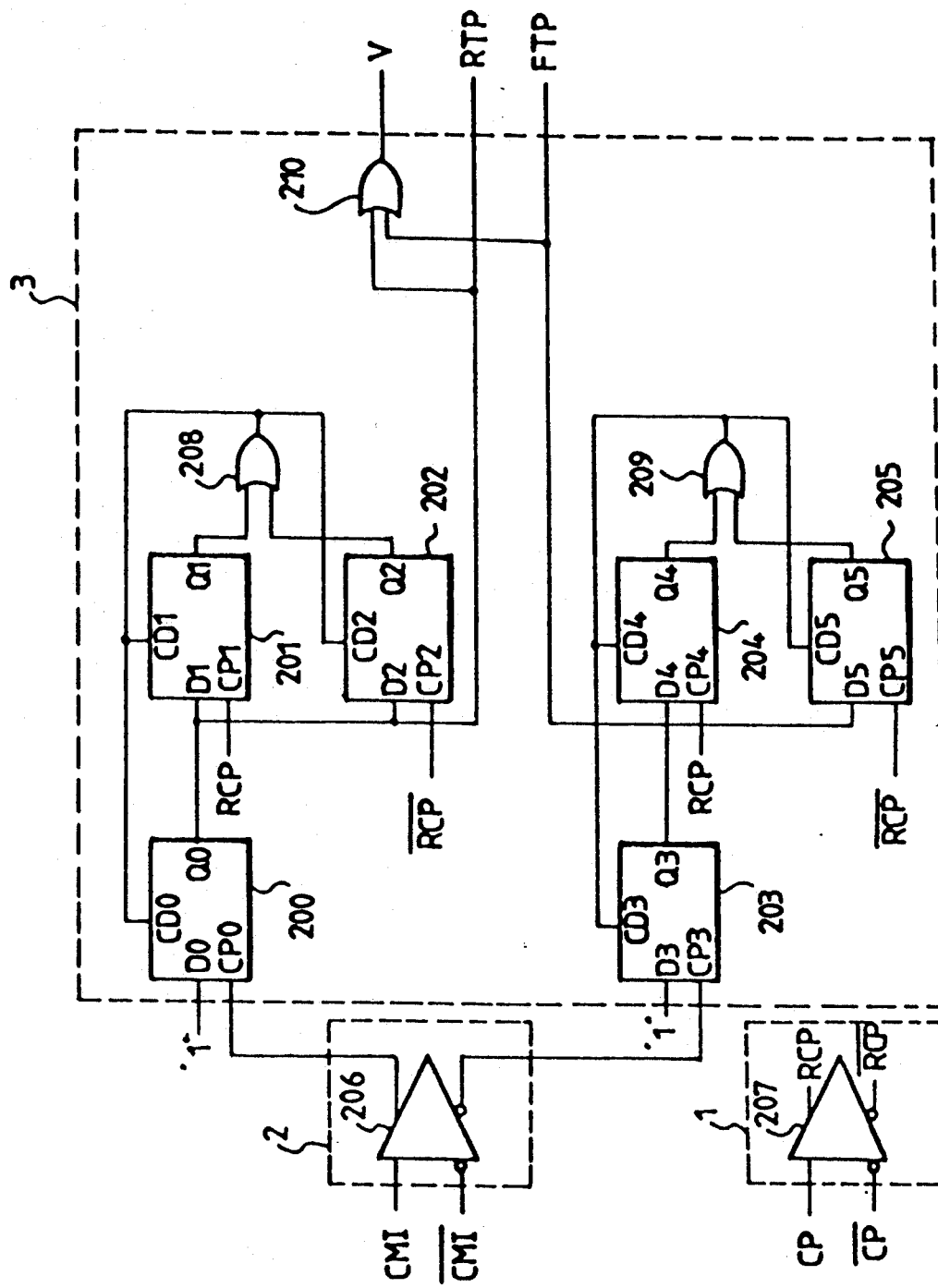
FIG. 2 is a schematic circuit diagram of a combination of a clock pulse generating means, a data output means and a inter-transitions time interval information output means.
Figure 3:
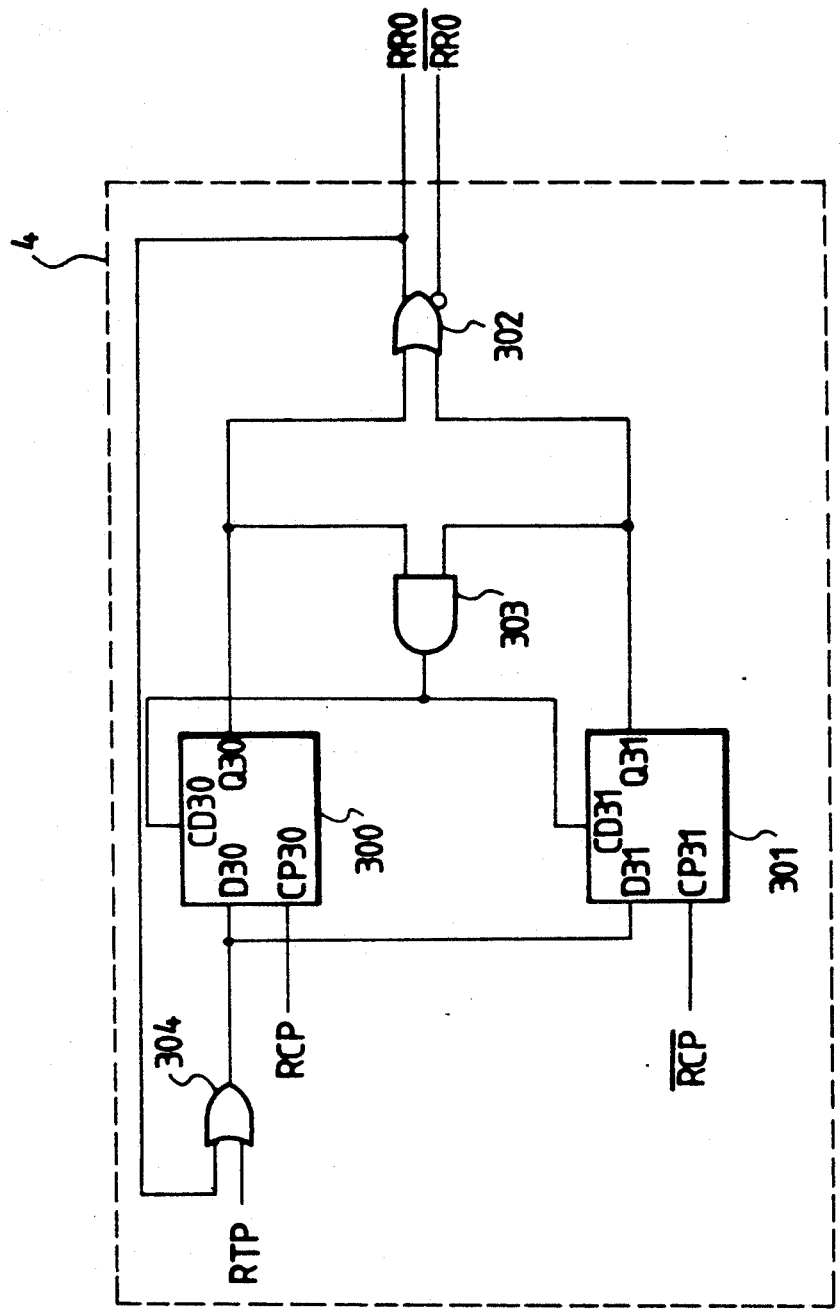
FIG. 3 is a schematic circuit diagram of a reference pulse generating means according to the invention.
Figure 4A:
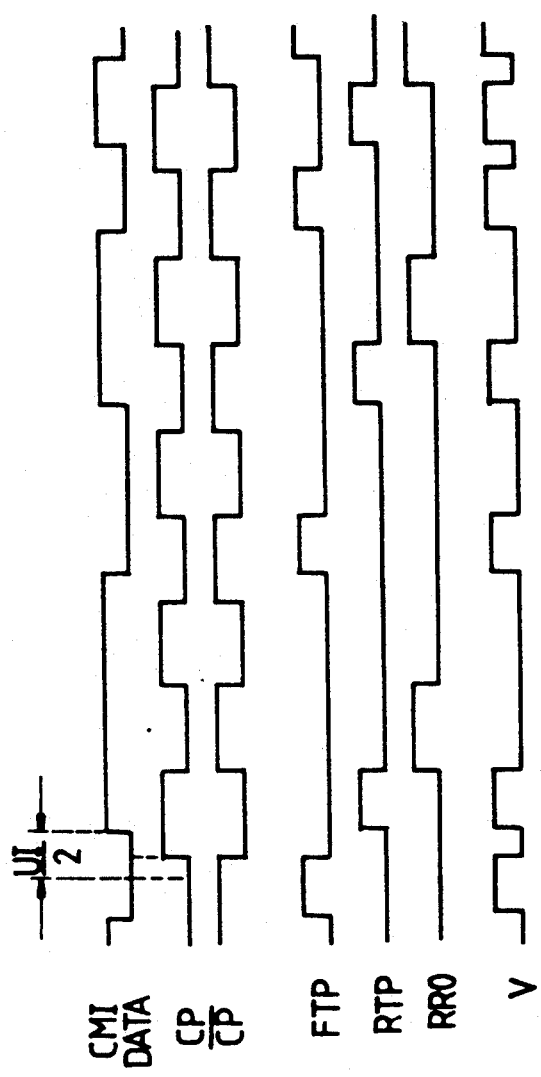

FIGS. 4(A) and (B) are timing diagrams useful to understand operations of the circuits of FIGS. 2 and 3, respectively.

Figure 5:
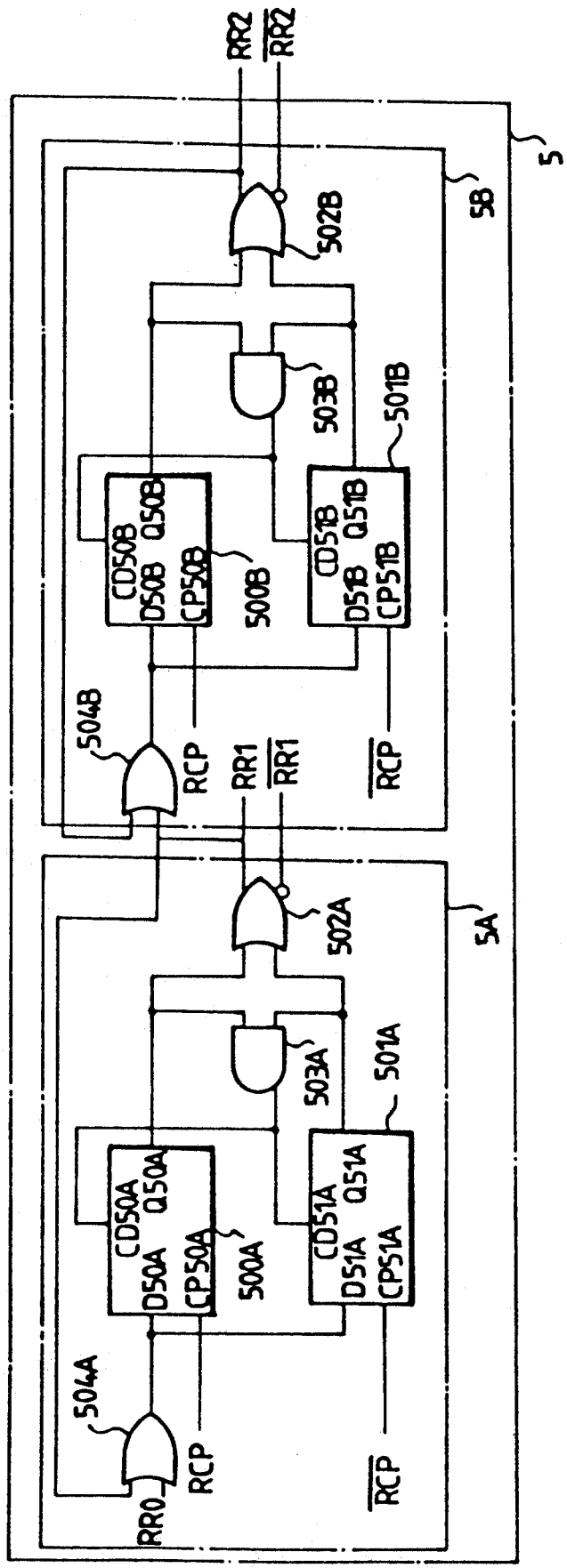

FIG. 5 is a schematic circuit diagram of a rising tranition detecting and 2-step half-period shifting means according to the invention.

Figure 6:
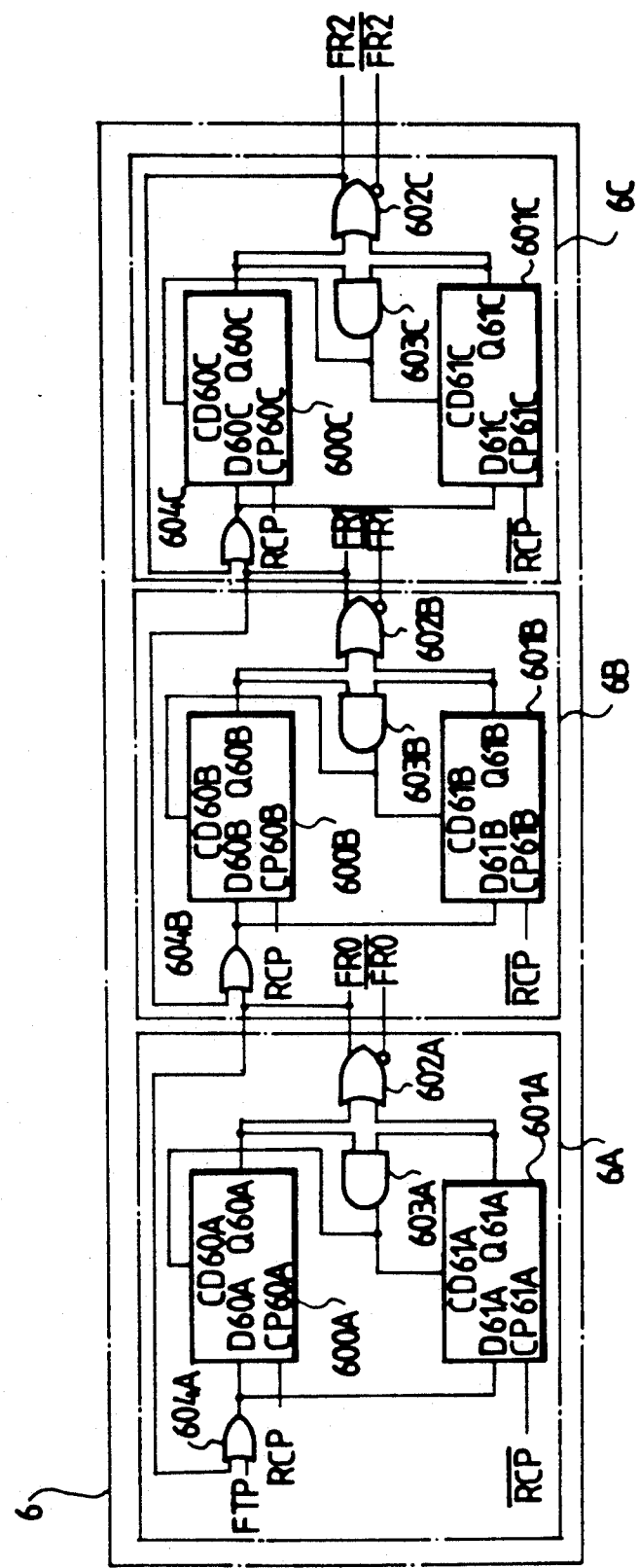

FIG. 6 is a schematic circuit diagram of a falling transition detecting and 3-step half-period shifting means according to the invention.

Figure 7:
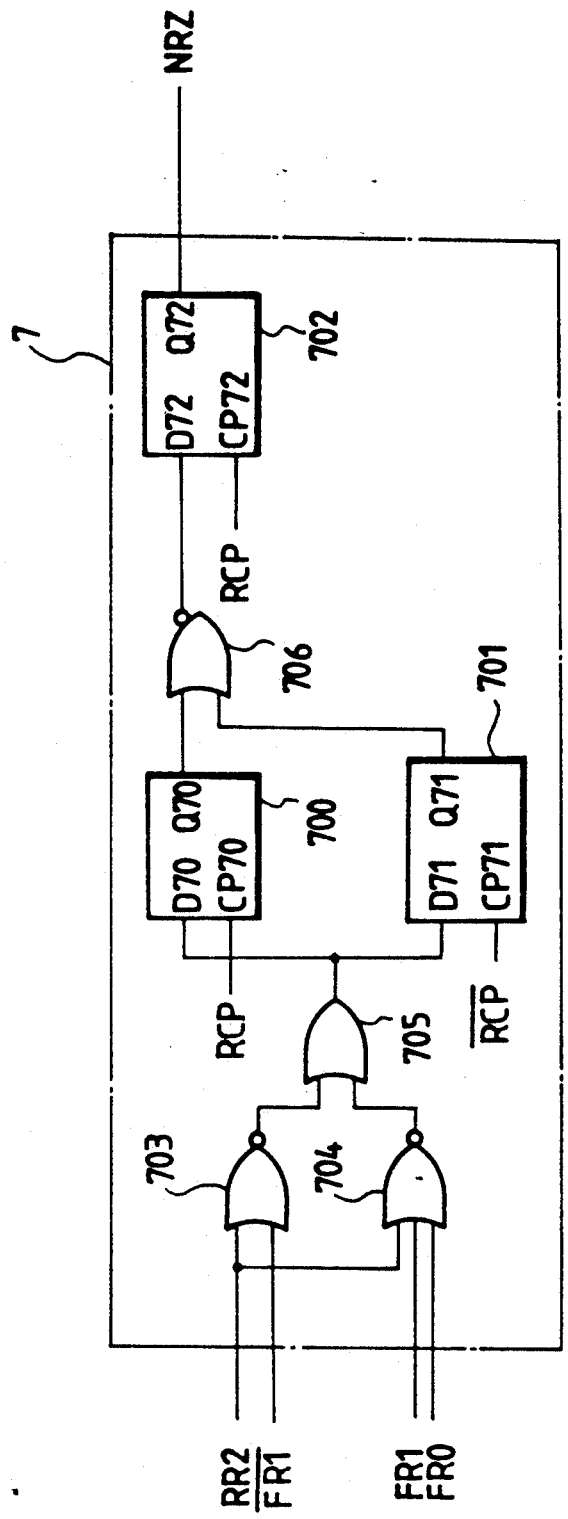

FIG. 7 is a schematic circuit diagram of a CMI/NRZ decoding means according to the invention.

Figure 8:
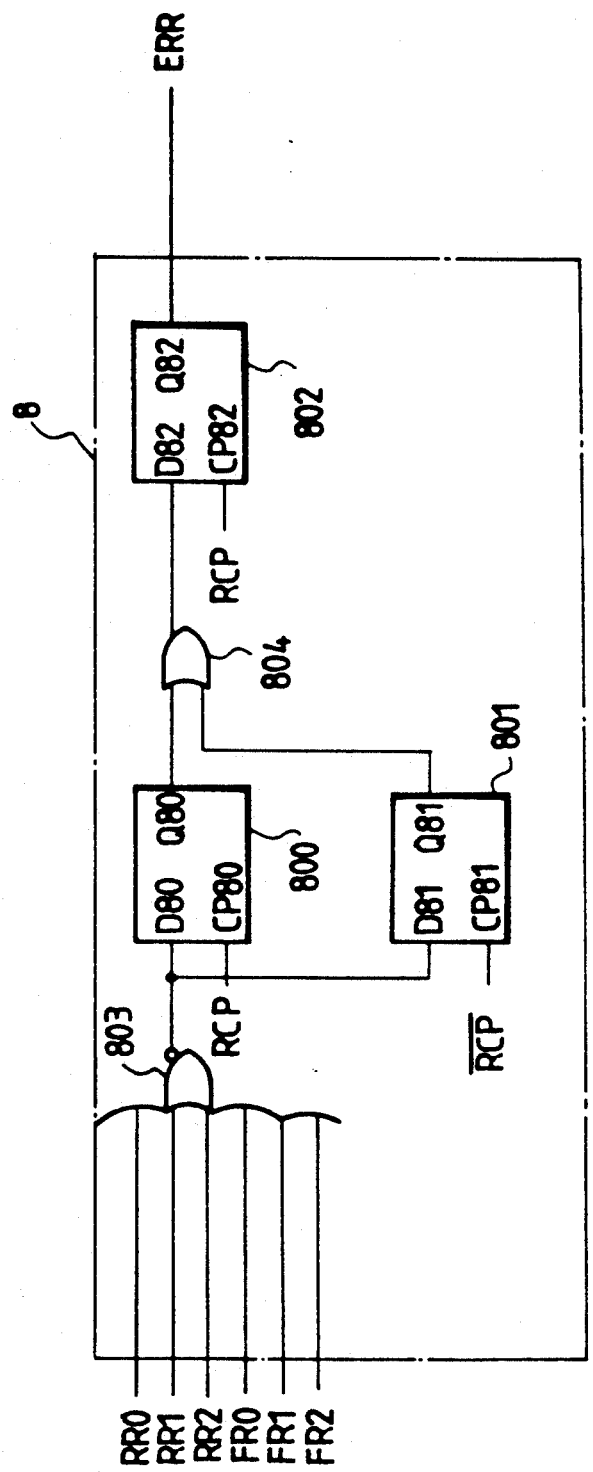
Figure 9:
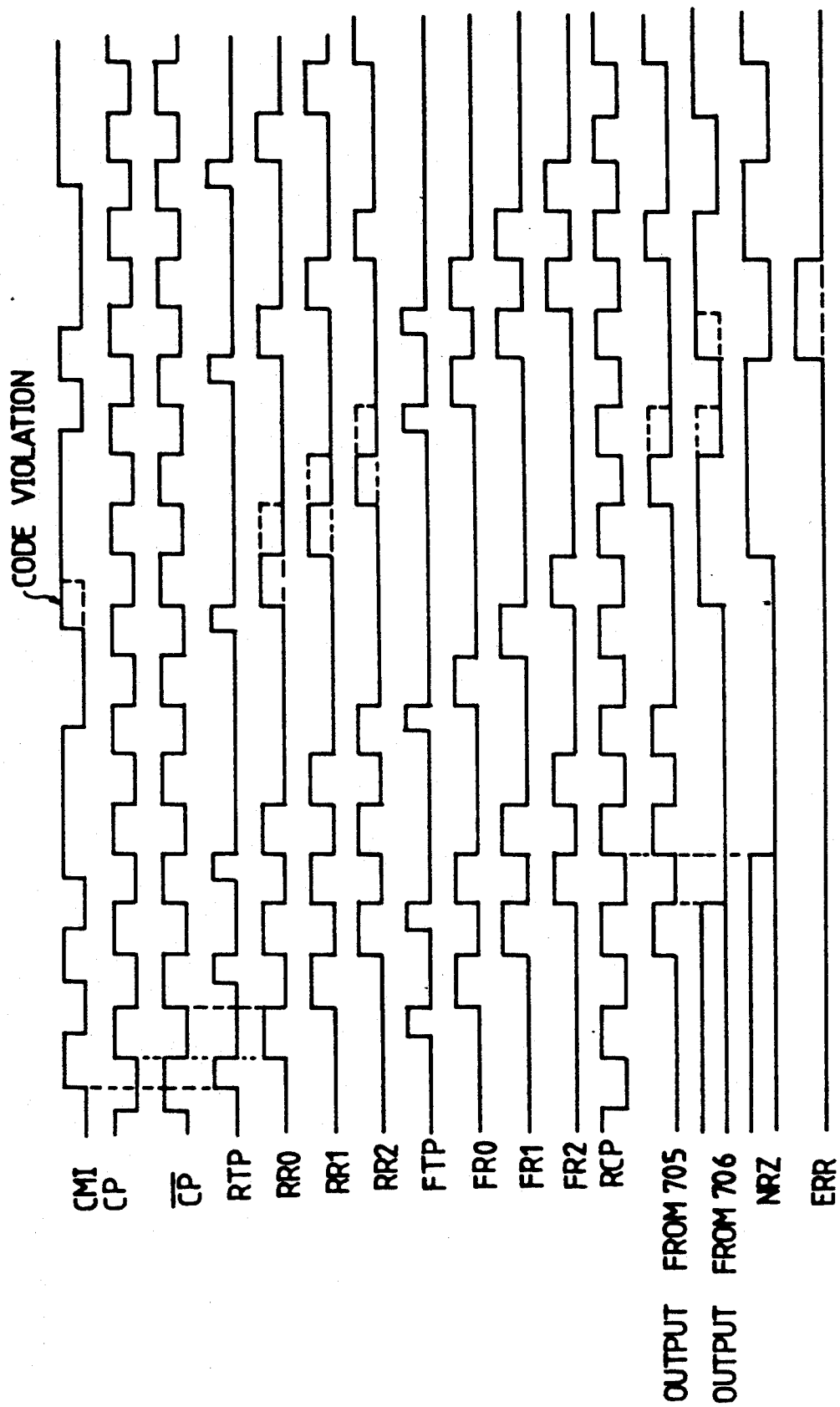

FIG. 8 is a schematic circuit diagram of a code violation detecting means according to the invention, and FIG. 9 is a timing diagram illustrating operations of the circuits of FIGS. 5, 6, 7 and 8.

DETAILED DISCRIPTION

Figure 1:
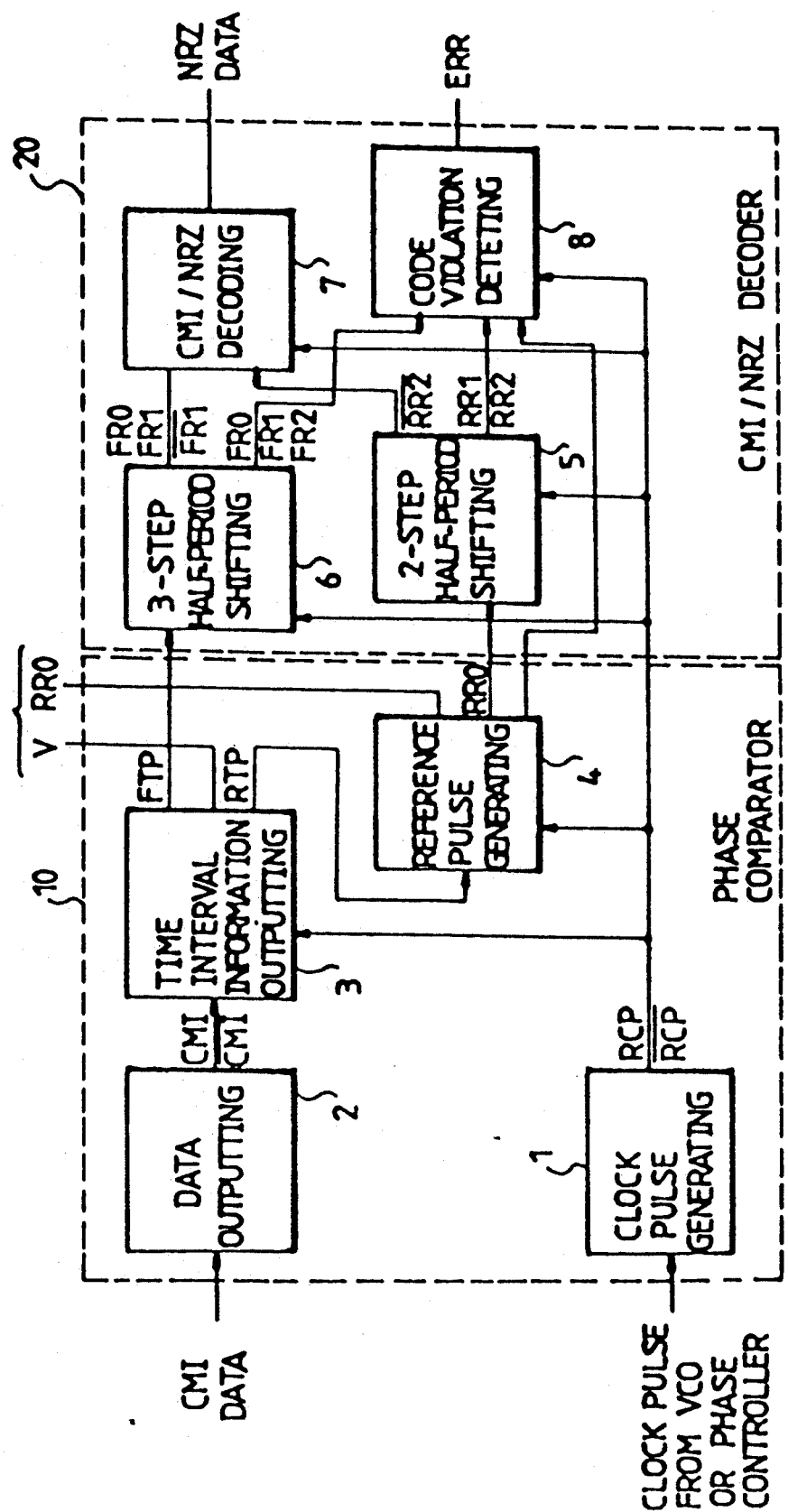

Now, referring to FIG. 1 wherein a schematic block diagram of a phase comparing and CMI/NRZ decoding apparatus according to the invention is shown, reference numeral 1 denotes a clock pulse generating means for generating in-phase and inverse-phase clock pulses, 2 denotes a data output means for outputting non-inverting data and inverting data, 3 denotes a inter-transitions time interval information output means for outputting information about time interval between a data transition and a clock pulse transition, 4 denotes a reference pulse generating means for generating a pulse having a half of the clock pulse period, 5 denotes a rising transition detecting and 2-step half-period shifting means, 6 denotes a falling transition detecting and 3-step half-period shifting means, 7 denotes a CMI/NRZ decoding circuit, 8 denotes a code violation detecting means, 10 denotes a phase comparator, and 20 denotes a CMI/NRZ decoder.

As shown in FIG. 1, the phase comparing and CMI/NRZ decoding apparatus according to the invention comprises two large parts, namely, one part of the phase comparator 10 and another part of the CMI/NRZ decoder 20.

The phase comparator 10 for comparing the phase of the transition with the phase of the center of the unit bit interval of the CMI data comprises; a data output means 2, a clock pulse generating means 1 for generating in-phase and inverse-phase pulses relative to the input clock pulse, a inter-transitions time interval information output means 3, connected to the data output means and the clock pulse generating means 1, for outputting information about the time interval between the data transition and the clock pulse transition, and a reference pulse generating means 4 connected to the inter-transitions time interval information output means 3 and the clock pulse generating means 1. This decoding apparatus realizes bit synchronization by outputting informations about phase relations between the center of the unit bit interval of the input CMI data and the transition of the clock pulse by means of two pulse having different pulse widths to a low pass filter or a integrator of a external PLL circuit.

The CMI/NRZ decoder 20 comprises; a falling transition detecting and 3-step half-period shifting means 6 connected to the clock pulse generating means 1 and the inter-transitions time interval information output means 3; a rising transition detecting and 2-step half-period shifting means 5 connected to the clock pulse generating means 1 and the reference pulse generating means 4; a CMI/NRZ decoding circuit 7 connected to the clock pulse generating means 1, to the rising transition detecting and 2-step half-period shifting means 5 and to the falling transition detecting and 3-step half-period shifting means 6; and a code violation detecting means 8 connected to the clock pulse generating means 1, to the reference pulse generating means 4, to the shifting means 5 and to the shifting means 6. This CMI/NRZ decoder 20 decodes the CMI data to the NRZ data and detects code violations, if they are.

The clock pulse generating means 1 generates a in-phase clock pulse (RCP) and inverse-phase clock pulse (/RCP), relative to the clock pulse derived from a VCO or a phase control circuit. The data output means 2 performs a function of outputting of non-inverting data (CMI) and inserting data (/CMI) relative to the input CMI data.

The inter-transitions time interval output means 3 is connected to the clock pulse generating means 1 and the data output means 2. This output means 3 outputs the information about the relation between the phase of the center of the unit bit interval of the input CMI data and the phase of the clock pulse transition, and outputs the information about whether transitions in the CMI data occur or not. Also, whenever rising transitions in the input CMI data occur, this output means 3 outputs a pulse [refer to RTP of FIG. 4(A)] having a pulse width corresponding to the time interval difference between a occurrence point of the falling transition of the CMI data and a occurrence point of the rising transition or falling transition of the clock pulse and being triggered by the rising transition of the CMI data. Also, whenever falling transitions in the CMI data occur, the output means 3 outputs a pulse [refer to FTP of FIG. 4(A)] having a pulse width corresponding to the time interval difference between the occurrence point of the falling transition of the CMI data and the occurrence point of the rising transition or falling transition of the clock pulse and being triggered by the falling transition of the CMI data.

The reference pulse generating means 4 for generating the reference pulse having a half of the clock pulse period is connected to the clock pulse generating means and the inter-transitions time interval information output means 3. Upon occurrence of the rising transition in the CMI data, the reference pulse generating means 4 produces a pulse [refer to RR0 of FIGS. 4 (A) and (B)] having a pulse width equivalent to a half of the clock pulse period.

The rising transition detecting and 2-step half-period shifting means 5 is connected to the clock pulse generating means 1 and the reference pulse generating means 4, and in the case of occurring of the rising transition in the CMI data, outputs two pulses, namely, one pulse [refer to RR1 of FIG. 9] being delayed by a half of the clock pulse period relative to the output (RR0) of the reference pulse generating means 4 and having a pulse width equivalent to a half of the clock pulse period, and another pulse [refer to RR2 of FIG. 9] being delayed twice by a half of the clock pulse (CP) period relative to the output (RR0) and having a pulse width equivalent to a half of the clock pulse period.

The falling transition detecting and 3-step half-period shifting means 6 is connected to the clock pulse generating means 1 and the inter-transitions time interval information output means 3. Upon occurring of the falling transition in the CMI data, this shifting means 6 outputs a pulse being delayed three times in sequence by a half of the clock pulse (CP) period relative to the phase of the falling transition of the pulse (FTP) derived from the inter-transitions time interval information output means 3 and having a pulse width equivalent to a half of the clock pulse period.

The CMI/NRZ decoding circuit 7 is connected to the clock pulse generating means 1, the shifting means 6 and the shifting means 5, and performs decoding of the CMI data to the NRZ data. The code violation detecting means 8 is connected to the clock pulse generating means 1, the shifting means 5, the reference pulse generating means 4, and the shifting means 6. Upon occuring of the rising or falling transition in the CMI data, the code violation detecting means 8 detects code violation and retimes the detected violation signals with the clock pulses, and then outputs the retimed signals.

Now, referring to FIG. 2, there are shown schematic circuit diagrams of the clock pulse generating means 1, the data output means 2, and the inter-transitions time interval output means 3. In this drawing, reference numerals 200 to 205 and 207 denote ECL receivers (Emitter-Coupled Logic Receiver), and 208, 209, and 210 denote OR gates.

As shown in FIG. 2, the clock pulse generating means comprising the ECL receiver 207 produces in-phase and inverse-phase clock pulses (RCP, /RCP: Retiming click pulse) compared with the clock pulse (CP, /CP) received from an external VCO or phase control circuit (not shown).

The data output means 2 comprising the ECL receiver 206 produces non-inverting data and inverting data relative to the input CMI data (CMI, /CMI).

The inter-transitions time interval information output means 3 comprises; a D-type flip-flop 200 having a clock input (CP0) to which non-inverting data from the ECL receiver 206 is inputted and having a data input (D0) to which a logic level "1" is inputted; a D-type flip-flop 201 having a data input (D1) connected to a output (Q0) of the D-type flip-flop 200 and having a clock input (CP1) to which an in-phase clock pulse (RCP) of the ECL receiver 207 is inputted; a D-type flip-flop 202 having a data input (D2) coupled to a output (Q0) of the D-type flip-flop 200 and having a clock input (CP2) to which an inverse-phase clock pulse (/RCP) of the ECL receiver 207 is inputted; an OR gate 208 having two inputs respectively coupled to the Q outputs (Q1,Q2) of the respective D-type flip-flops 201 and 202 and having an output coupled to the clear inputs (CD0, CD1, CD2) of the respective D-type flip-flops 200, 201 and 202; a D-type flip-flop 203 having a clock input (CP3) to which a inverting data of the ECL receiver 206 is inputted and having a D input (D3) to which a logic level "1" is inputted; a D-type flip-flop 204 having a D input (D4) connected to the Q output(Q3) of the D-type flip-flop 203 and having a clock input (CP4) to which the in-phase clock pulse (RCP) of the ECL receiver 207 is inputted; a D-type flip-flop 205 having a D input(D5) connected to the Q output(Q3) of the D-type flip-flop 203 and having a clock input (CP5) to which a inverse-phase clock pulse (/RCP) of the ECL receiver 207 is applied; an OR gate 209 having two inputs respectively coupled to Q outputs (Q4, Q5) of the respective D-type flip-flops 204 and 205 and having an output coupled to clear inputs (CD3, CD4, CD5) of the respective D-type flip-flops(203, 204 and 205); and an OR gate 210 having two inputs to which output signals (RTP: Rising Transition Pulse, FTP: Falling Transition Pulse) from the Q outputs (Q0 and Q3) of the respective D-type flip-flops 200 and 203 are inputted respectively.

The D inputs(D0,D3) of the two D-type flip-flops 200 and 203 are always in logic level "1" state. Therefore, if a rising transition occurs in the CMI data and the clear input(CDO) of the D-type flip-flop 200 is in logic level "0" state, the Q output (Q0) of the D-type flip-flop 200 becomes logic level "1" state. Also, if a falling transition in the incoming CMI data occurs and the cleat input(CD3) of the D-type flip-flop 203 is in logic level "0" state, the Q output (Q3) of the D-type flip-flop 203 becomes logic level "1" state.

Also, as described above, if a rising transition in the incoming CMI data occurs, the Q output (QO) of the D-type flip-flop 200 becomes logic level "1" and then is applied to the D inputs(D1,D2) of the two D-type flip-flops 201 and 202. Then, the output of one flip-flop of two D-type flip-flops 201 and 202 in which the transition occurs first, becomes logic level "1" state, and the output of the OR gate 208 becomes logic level "1" state. Therefore, the clear inputs(CD0,CD1, CD2) of the respective D-type flip-flops 200, 201 and 202 respectively coupled to the output of the OR gate 208 become logic level "1" and therefore, outputs (Q0,Q1,Q3) of the respectively three D-type flip-flops 200, 202 and 202 become logic level "0".

Accordingly, each time the rising transition in the CMI data occurs, the D-type flip-flop 200 produces a pulse (RTP) which is triggered by the riging transition in the CMI data and cleared by the clock pulse transition produced most closely to the rising transition in the CMI data. This pulse has a width corresponding to the time interval between the riging transition in the CMI data and the clock pulse transition most close to the rising transition in the CMI data.

In addition, each time the falling transition in the CMI data occurs, the D-type flip-flop 203 outputs a pulse (FTP) which is triggered by the falling transition in the CMI data and cleared by the clock pulse transition produced most closely to the falling transition in the CMI data. This pulse has a width corresponding to the time interval between the falling transition in the CMI data and the clock pulse transition most close to the falling transition. Accordingly, the OR gate 210 performs logic OR-ing of the RTP signal and FTP signal and outputs a output pulse (V: Variance) having a width equivalent to the time interval between the transition of the incoming CMI data and the clock pulse transition most close to it. In result, if the clock pulse transition is positioned in the center of the unit bit interval (UI) of the incoming CMI data, the OR gate 210 outputs a output pulse (V) having a width equivalent to $\frac{1}{4}$ clock pulse period each time the transition in the CMI data occurs. But, if the clock pulse transition is positioned before the center of the unit bit interval of the incoming CMI data, the OR gate 210 outputs a output pulse (V) having a width smaller than $\frac{1}{4}$ clock pulse period each time the transition in the CMI data occurs, and if the clock pulse transition is positioned after the center of the unit bit interval of the incoming CMI data, the OR gate 210 outputs a output pulse(V) having a width larger than $\frac{1}{4}$ clock pulse period each time the transition in the CMI data occurs.

Referring now to FIG. 3 illustrating an embodiment of the reference pulse generating means 4 according to the invention, reference numerals 300 and 301 denote D-type flip-flops, 302 denotes a NOR/OR gate, 303 denotes an AND gate, and 304 denotes an OR gate.

As shown in FIG. 3, the reference pulse generating means 4 according to the invention comprises; an OR gate 304 having two inputs to one of which an output signal (RTP) of the inter-transitions time interval information output means 3 is applied; a D-type flip-flop 300 having a data input (D30) coupled to the output of the OR gate 304 and having a clock input(CP30) to which the in-phase clock pulse (RCP) is applied; a D-type flip-flop 301 having a data input(D31) coupled to the output of the OR gate 304 and a clock input(CP31) to which the inverse-phase clock pulse(/RCP) is applied; an AND gate 303 having two inputs coupled to the outputs(Q30 and Q31) of the respective D-type flip-flops 300 and 301 respectively and an output coupled to the clear inputs(CD30 and CD31) of the respective D-type flip-flops 300 and 301; and a NOR/OR gate 302 having two inputs coupled to the Q outputs(Q30 and Q31) of the respective D-type flip-flops 300 and 301 respectively and an output connected to the another input of the OR gate 304.

If the rising transition in the CMI data and then the output signal (RTP) becomes a logic level "1" state, a logic level "1" is applied to the D inputs (D30 and D31) of the respective D-type flip-flops 300 and 301 respectively.

Accordingly, of two flip-flops 300 and 301, only the output of one flip-flop to which a clock pulse having a rising transition is inputted, becomes a logic level "1" and the output of the other flip-flop stays at logic level "0" state.

But, if another transition occurs, this output of the other flip-flop becomes logic level "1". Therefore, during the output signal (RTP) maintains a logic level "1" state, if the second transition occurs in the clock inputs (CP30, CP31) of the respectively flip-flops 300 and 301, the output of the AND gate 303 becomes a logic level "1" and then two flip-flops 300 and 301 are cleared.

Whenever a rising transition in the CMI data occurs, the NOR/OR gate 302 produces a pulse(RR0 or /RR0) which has a pulse width equivalent to a half of the clock pulse period and is triggered by a rising or falling transition of the clock pulse. (refer to FIG. 4)

Figure 4B:
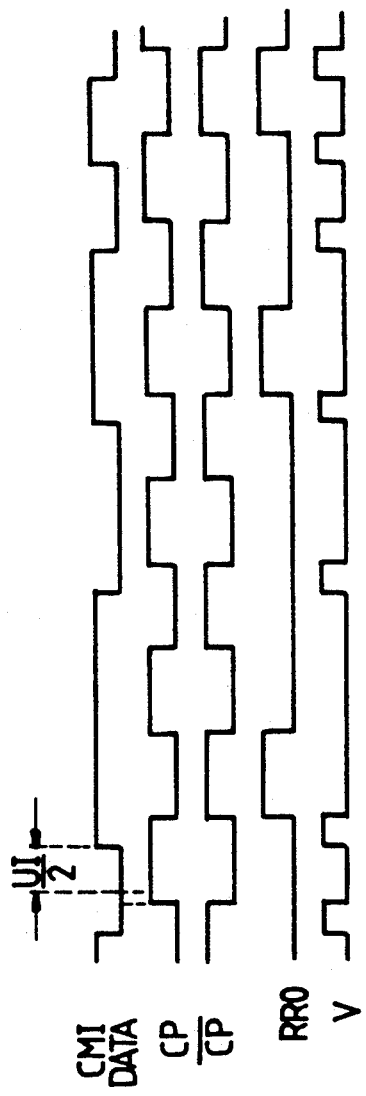

FIG. 4(A) is a timing diagram useful to understand operation of the circuit of FIG. 2 in the case that the clock pulse transition occurs after the center of the unit bit interval of the CMI data. FIG. 4(B) is a timing diagram useful to understand operation of the circuit of FIG. 3 in the case that the clock pulse transition occurs before the center of the unit bit interval of the CMI data.

The pulse width of the output(V) of the inter-transitions time interval information output means 3 changes depending on the relation of the phase of the clock pulse transition with the phase of the center of the unit bit interval of the CMI data, but the output (RR0) of the reference pulse generating means 4 is independent of this phase relation. In the case that the rising transition in the CMI data occurs, this means 4 produces a pulse having a width equivalent to a half of the clock pulse period.

As shown in FIG. 4(A), in the case that the clock pulse transition occurs after the center of the unit bit interval of the CMI data, a pulse width of the output signal(V) of the inter transitions time interval information output means 3 is larger than a quarter of the clock pulse period, but as shown in FIG. 4(B), in the case that the clock pulse transition occurs before the center of the unit bit interval of the CMI data, a pulse width of the output signal(V) of the inter-transitions time interval information output means 3 is smaller than a quarter of the clock pulse period.

Because, in the CMI, the number of rising transitions equals to a half of the number of the total transitions, the number of the output pulses(V) produced by the inter-transitions time interval information output means 3 each time the transition in the CMI data occurs, is a double of the number of the output pulses (RR0) produced by the reference pulse generating means 4. In the case that the phase of the clock pulse transition is coincident with the phase of the center of the unit bit interval of the incoming CMI data, the output means 3 produces a pulse having a width equivalent to a quarter of the clock pulse period, but the reference pulse generating means 4 produces a pulse having a width equivalent to a half of the clock pulse period. Therefore, the sum of two pulse widths of the output pulses of the output means 3 is equal to a width of one pulse from the reference pulse generating means 4. Accordingly, in the case of integrating or low-pass filtering the level difference between the output pulse(V) and the output pulse (RR0), because the DC component is dominant, the phase relation of the clock pulse transition with the center of the unit bit interval of the CMI data appears as the output of a low-pass filter or integrator.

FIG. 5 illustrates an embodiment of a rising transition detecting and 2-step half-period shifting means according to the invention and FIG. 6 illustrates an embodiment of a falling transition detecting and 3-step half-period shifting means according to the invention. In these figures, reference numerals 500A, 501A, 500B, 501B, 600A, 601A, 600B, 601B, 600C, and 601C, denote D-type flip-flops, 503A, 503B, 603A, 603B, and 603C denote AND gates, 502A, 502B, 602A, 602B, and 602C denote NOR/OR gates, 504A, 504B, 604A, 604B, and 604C denote OR gates, and 5A, 5B, 6A, 6B, and 6C denote half-period shifting circuits.

As shown in FIG. 5, the rising transition detecting and 2-step half-period shifting means 5 comprises two half-period shifting circuits 5A and 5B. The first shifting circuit 5A comprises; a OR gate 504A having an input to which the output signal (RR0) from the reference pulse generating means 4 is applied; a D-type flip-flop 500A having a data input (D 50A) coupled to the output of the OR gate(504A) and having a clock input (CP 50A) to which the in-phase click pulse (RCP) is applied; a D-type flip-flop 501A having a data input (D 51A) to which the output signal (RR0) from the reference pulse generating means 4 is applied via the OR gate 504A and having a clock input(CP 51A) to which the inverse-phase clock pulse (RCP) is applied; a AND gate 503A two inputs coupled to the Q outputs (Q50A, Q51A) of the respective D-type flip-flops 500A and 501A; and a NOR/OR gate 502A having two inputs coupled to the outputs (Q50A, Q51A) of the respective D-type flip-flops 500A and 501A respectively and having two outputs for outputting respectively output signals(RR1, /RR1), one of which is coupled to the other input of the OR gate 504A. The second shifting circuit 5B comprises an OR gate 504B having two inputs one of which is coupled to the output (RR1) of the first shifting circuit 5A and having an output coupled to inputs(D50B, D51B) of respective D-type flip-flops 500B and 501B, two D-type flip-flops 500B and 501B coupled to the output of the OR gate 504B, a AND gate 503B, and a NOR/OR gate 502B.

Because the configuration of this shifting circuit 5B is largely similar to that of the first shifting circuit 5A, further description of its configuration is omitted.

After the rising transition in the CMI data occurs, if the first clock pulse transition occurs and the output (RR0) from the reference pulse generating means 4 becomes a logic level "1", to the data inputs (D50A, D51A) of the respective D-type flip-flops 500A and 501A a logic level "1" is applied respectively. At this time, the output of D-type flip in which the rising transition occurs in its input becomes a logic level "1", but the output of the other flip-flop stays at a logic level "0" and then becomes a logic level "1" after the rising transition in the clock pulse input occurs.

After the output (RR0) from the reference pulse generating means 4 becomes a logic level "1", if the second transition is occurs in the inputs of the respective flip-flops 500A and 501A, the output of the AND gate becomes a logic level "1" and thereby the two flip-flops 500A and 501A are cleared. Accordingly, after the rising transition in the CMI data occurs, if the second transition in the clock pulse occurs, the NOR/OR gate 502A produces pulses (RR1, /RR1) having a width equivalent to a half of the clock pulse period and having a type triggered by the rising or falling transition of the clock pulse. The pulse (RR1) has a waveform delayed by a half of the clock pulse period relative to the waveform of the output signal (RR0) from the reference pulse generating means 4, and the pulse (/RR0) has a inverse waveform relative to the waveform of the output signal(RR0).

The operation of the second shifting circuit 5B is equal to that of the first shifting circuit 5A as described above. Therefore, the output signal (RR2) from the second shifting circuit 5B has a waveform further delayed by a half of the clock pulse period relative to that of the output pulse (RR1) from the first shifting circuit 5A.

As shown in FIG. 6, the falling transition detecting and 3-step half-period shifting means 6 comprises three half-period shifting circuits 6A, 6B and 6C. The first half-period shifting circuit 6A comprises an OR gate 604A having an input coupled to the output (FTP) of the D-type flip-flop 203 of the inter-transitions time interval information output means 3, two D-type flip-flops 600A and 601A having respectively inputs (D60A and D61A) coupled to the output of the OR gate 604A, an AND gate 603A, and a NOR/OR gate 602A.

The configuration of the first half-period shifting circuit 6A is equal to that of the first half-period shifting circuit 5A in the rising transition detecting and 2-step half-period shifting means 5. Also, the second half-period shifting circuit 6B comprises an OR gate 604B having an input coupled to the output (FR0) of the first half-period shifting circuit 6A, two D-type flip-flops 600B and 601B having respectively data inputs (D60B and D61B) coupled to the output of the OR gate 604B, an AND gate 603B, and a NOR/OR gate 602B. The configuration of the second half-period shifting circuit 6B is equal to that of the first half-period shifting circuit 6A. In addition, the third half-period shifting circuit 6C comprises an OR gate 604C having an input coupled to the output(FR1) of the second half-period shifting circuit 6B, two D-type flip-flops 600C and 601C having respectively data inputs (D60C and D61C) coupled to the output of the OR gate 604C, an AND gate 603C and a NOR/OR gate 602C, and its configuration and operation are equal to those of the second half-period shifting circuit 6B.

In the first half-period shifting circuit 6A of the falling transition detecting and 3-step half-period shifting means 6, the data inputs (D60A and D61A) of the respective D-type flip-flops 600A and 601A are coupled to the output (FTP) of the D-type flip-flop 203 in the inter-transitions time interval information output means 3. Accordingly, the OR output of the NOR/OR gate 602A produces a pulse being triggered by the first clock pulse transition after occuring of the falling transition in the incoming CMI data and having a pulse width equivalent to a half of the clock pulse period.

In addition, the data inputs(D60B and D61B) of the respective D-type flip-flops 600B and 601B in the second half-period shifting circuit 6B are connected to the output(FR0) of the NOR/OR gate 602A in the first half-period shifting circuit 6A through the OR gate 604B. Therefore, the output(FR1) of the NOR/OR gate 602B in the second half-period shifting circuit 6B produces a pulse being triggered by the second clock pulse transition after occuring of the falling transition in the incoming CMI data and having a pulse width equivalent to a half of the clock pulse period.

Additionally, the data inputs (D60C and D61C) of the respective D-type flip-flops 600C and 601C in the third half-period shifting circuit 6C are connected to the output (FR1) of the NOR/OR gate 602B in the second half-period shifting circuit 6B through the OR gate 604C. Accordingly, the output(FR2) of the OR gate 602C in the third half-period shifting circuit 6C produces a pulse being triggered by the third clock pulse transition after occuring of the falling transition in the incoming CMI data and having a pulse width equivalent of a half of the clock pulse period.

Now, referring to FIGS. 7 and 8 illustrating an embodiment of a CMI/NRZ decoding means 7 and an embodiment of a code violation detecting means 8 respectively, reference numerals 700, 701, 702, 800, 801 and 802 denote D-type flip-flops, 703, 704, 706 and 803 denote NOR gates, and 705 and 804 denote OR gates.

In NRZ/CMI encoding, a logic level "0" in the NRZ data is encoded to a logic level "01" in the CMI data, and a logic level "1" in the NRZ data is inverted and encoded to a logic level "11" or "00" in the CMI data.

The CMI/NRZ decoding means according to the invention utilizes a code violation detecting method by which only CMI codes corresponding to a logic level "0" in the NRZ data are selected and the rest are decoded to a logic level "1" in the NRZ data. Accordingly, "010d" (d is don't care bit) and "0111" in the CMI data are decoded to a logic level "0" in the NRZ data, and the rest are decoded to a logic level "1" in the NRZ data. The code violation detecting means 8 detects CMI codes comprising more than four "1"s or "0"s continuously repeated and outputs these codes separately from the decoded data. At this time, such decoded NRZ data appears as "1".

As shown in FIG. 7, the CMI/NRZ decoding means 7 according to the invention comprises; a NOR gate 703 having two inputs respectively coupled to the output(/RR2) of the rising transition detecting and 2-step half-period shifting means 5 and the output(/FR1) of the second shifting circuit 6B in the falling transition detecting and 3-step half-period shifting means 6; a NOR gate 704 having three input one of which being coupled to the output(/RR2) of the shifting means 5 and the remaining two inputs being coupled to the outputs(FR0,FR1) of the first and second shifting circuits 6A and 6B in the shifting means 6 respectively; an OR gate 705 having two inputs coupled to the outputs of the respective NOR gates 703 and 704 respectively; a D-type flip-flop 700 having a data input(D70) coupled to the output of the OR gate 705 and having a clock input(CP70) to which the in-phase clock pulse(/RCP) is applied; a D-type flip-flop 701 having a data input(D71) coupled to the output of the OR gate 705 and having a clock input(CP71) to which the inverse-phase clock pulse(/RCP) is applied; a NOR gate 706 having two inputs coupled to the outputs(Q70, Q71) of the respective D-type flip-flops 700 and 701 respectively; and a D-type flip-flop 702 having a data input(D72) coupled to the output of the NOR gate 706 and having a clock input(CP72) to which the in-phase clock pulse (RCP) is applied.

If the output(/RR2) from the shifting means 5 is a logic level "0" and also the output(/FR1) from the second shifting circuit 6B in the shifting means 6 is a logic level "0", the output from the NOR gate 703 becomes a logic level "1". In the case that after occurring of the rising transition in the incoming CMI data, the falling transition in the CMI data occurs between the second clock pulse transition and the thud clock pulse transition, both outputs(/RR2, /FR1) become a logic level "0". In other words, in such case, the CMI data is "010d".

Also, if the output(/RR2) from the shifting means 5 is a logic level "0" and both the outputs(FR0,FR1) from the shifting means 6 are a logic level "0", the output from the NOR gate 704 becomes a logic level "1". In the case that after occurring of the rising transition in the incoming CMI data, no falling transition in the CMI data occurs until the third clock pulse transition occurs, all these outputs (/RR2,FR0,FR1) become logic level "0". In such case, the CMI data is "0111".

If at least one of the outputs from the respective NOR gates 703 and 704 becomes a logic level "1", the output from one flip-flop of two D-type flip-flops 700 and 701 in which the rising transition occurs first, becomes a logic level "1" and then is applied to the NOR gate 706. At this time, the output from the NOR gate 706 becomes a logic level "0". If the output from the NOR gate 706 maintains a logic level "0" and the rising transition occurs in the clock pulse input(CP72) of the D-type flip-flip 702, the output of the D-type flip-flop 702 becomes a logic level "0".

As shown in FIG. 8, the code violation detecting means 8 according to the invention comprises; a NOR gate 803 having an input coupled to the output(RR0) of the reference pulse generating means 4 and having two inputs coupled to the outputs(RR1,RR2) of the rising transition detecting and 2-step half-period shifting means 5 respectively, and also having three inputs coupled to the outputs(FR0,FR1,FR2) of the falling transition detecting and 3-step half-period shifting means 6 respectively; a D-type flip-flop Boo having a data input(D80) coupled to the output of the NOR gate 803 and having a clock input to which the in-phase clock pulse (RCP) is applied; a D-type flip-flop 801 having a data input (D81) coupled to the output of the NOR gate 803 and having a clock input to which the inverse-phase clock pulse(/RCP) is applied; an OR gate 804 having two inputs coupled to the Q outputs (Q80, Q81) of the respective D-type flip-flops 800 and 801 respectively; and an OR gate 802 having a data input (D82) coupled to the output of the OR gate 804, and a clock input (CP82) to which the in-phase clock pulse (RCP) is applied, and having an output (Q82) for outputting error signals(ERR).

If the output(RR0) from the reference pulse generating means is a logic level "0" and both outputs(RR1,RR2) from the rising transition detecting and 2-step half-period shifting means 5 are a logic level "0", and also all outputs(FR0,FR1,FR2) from the falling transition detecting and 3-step half-period shifting means 6 are a logic level "0", the output from the NOR gate 803 becomes a logic level "1". In the case that no transition in the incoming CMI data occurs until five clock pulse transitions occur continuously, all these six outputs (RR0,RR1,RR2,FR0,FR1,FR2) become a logic level "0". In such case, the incoming CMI data is, for example, "0000" or "1111".

Accordingly, in two D-type flip-flops 800 and 801 respectively having data inputs coupled to the output of the NOR gate 803, the output of one flip-flop in which the rising transition occurs first in its input becomes a logic level "1", and then is applied to the input of the OR gate 804. Then, the D-type flip-flop 802 connected to the output of the OR gate 804 performs a function of code error detection, by retiming code error information, that is, a logic level "1", with the in-phase clock pulse (RCP) and outputting the retimed information.

Here-in-after, operations of the CMI/NRZ decoding means 7 and the code error detecting means 8 according to the invention will be described with reference to a timing diagram of FIG. 9.

As shown in FIG. 9, a clock pulse(CP) derived from a VCO or phase control circuit maintains same waveform before arriving at the D-type flip-flop 702 in the CMI/NRZ decoding means 7 and before arriving at the D-type flip-flop 802 in the code error detecting means 8, in other words, before retiming the decoded NRZ data and the detected code error signal with the in-phase and inverse-phase clock pulses.

Upon occurring of the rising transition in the CMI data, the reference pulse generating means 4 produces a pulse(RR0) being triggered by the clock pulse and having a pulse width equivalent to a half of the clock pulse period. Then, the rising transition detecting and 2-step half-period shifting means 5 delays this pulse twice in sequence by a half of the clock pulse period, and outputs once-delayed pulse and a twice-delayed pulse via its outputs(RR1,RR2).

In addition, if the falling transition in the CMI data occurs, the output(FTP) of the D-type flip-flop 203 in the inter-transitions time interval information output means 3 is triggered and then cleared by the clock pulse transition most close to the falling transition in the CMI data. At this time, the falling transition detecting and 3-step half-period shifting means 6 produces, at its output(FR0), a pulse being triggered by the clock pulse clearing the output of the D-type flip-flop 203 and having a pulse width equivalent to a half of clock pulse period, and then further delays such produced pulse twice in sequence by a half of the clock pulse period, thereby outputting twice-delayed pulse(FR1) and three times-delayed pulse(FR2).

In CMI encoding rule, "0" in the NRZ data corresponds to "01" of "010d" (where, d is don't care bit) or "01" of "0111" in the CMI data, as the case may be. For example, there are two cases, one case where the output(RR2) from the rising transition detecting and 2-step half-period shifting means 5 is a logic level "1" and the output (FR1) from the falling transition detecting and 3-step half-period shifting means 6 is a logic level "1", and the other case where the output(RR2) from the rising transition detecting and 2-step half-period shifting means 5 and both outputs(FR0,FR1) from the falling transition detecting and 3-step half-period shifting means are a logic "0".

Then, the output from the OR gate 705 in the CMI/NRZ decoding means 7 becomes a logic level "1". At this time, by retiming the output from the OR gate 705 with the in-phase or inverse-phase clock pulse, and then inverting it by means of the NOR gate 706, and then retiming it with the in-phase clock pulse(RCP), the decoded NRZ data can be obtained.

However, if no transition in the CMI data occurs until more than 5 clock pulse transitions occur, that is, the CMI data is "1111" or "0000", all of the output(RR0) from the reference pulse generating means 4, the outputs(RR1,RR2) from the rising tiansition detecting and 2-step half-period shifting means 5, and the outputs(FR0,FR1,FR2) from the falling transition detecting and 3-step half-period shifting means 6, become logic level "0". Then, by retiming such detected signal with the in-phase clock pulse(RCP), ERR signal of FIG. 9 is obtained. In FIG. 9, dotted line denotes the case where no code error occurs.

The apparatus according to the invention for performing phase detection for bit synchronization of CMI data and decoding of CMI data to NRZ data, provides the following specific acting effects.

Firstly, the apparatus according to the invention performs bit synchronization and decoding of CMI data to NRZ data, by means of the clock pulse having a period equal to a double of the unit bit interval of the incoming CMI data.

Secondly, the apparatus according to the invention is automatically controlled by use of a feedback loop, so that the clock pulse transition can be positioned in the center of the unit bit interval of the CMI data, namely, in the center of the eye pattern of the CMI data, and therefore operates stably without regard to external circumstances.

Thirdly, the apparatus according to the invention operates stably although the phase of the clock pulse changes by 180 degrees and extends a phase margin up to 360 degrees.

Finally, the apparatus according to the invention is constituted by simple and standardized digital logic elements and enables economization and therefore integration of circuits.

We claim:

1. A phase comparing and CMI/NRZ decoding apparatus for decoding CMI data to NRZ data according to clock pulse transition in the center of the unit bit interval of incoming CMI(Code Mark Inversion) data comprising:
    a clock pulse generating means for generating in-phase and inverse-phase clock pulses compared with an incoming clock pulse;
    a data output means for outputting inverted data and non-inverted data relative with the incoming CMI data;
    a inter-transitions time interval information output means, connected to the clock pulse generating means and the data output means, for outputting information about the relations of the phase of the transition of the clock pulse and the phase of the center of the unit bit interval (UI) of the CMI data, and for outputting information about the presence or not of transition occurrence in the CMI data;
    a reference pulse generating means, connected to the clock pulse generating means and the inter-transitions time interval information output means, and upon occurring of the rising transition in the input CMI data, producing a pulse being triggered by rising transition or falling transition of the clock pulse from the clock pulse generating means and having a pulse width equivalent to ½ clock pulse period;
    a rising transition detecting and, 2-step half-period shifting means connected to the clock pulse generating means and the reference pulse generating means, and upon occuring of the rising transition in the CMI data, outputting a pulse being delayed twice in sequence by ½ clock pulse period relative to the output of the reference pulse generating means and having a pulse width equivalent to a half of the clock pulse period;
    a falling transition detecting and 3-step half-period shifting means connected to the clock pulse generating means and the inter-transitions time interval information output means and, upon occurring of the falling transition in the CMI data, outputting a pulse being delayed three times in sequence by ½ clock pulse period relative to the falling transition of a pulse produced by the inter-transitions time interval information output means and having a pulse width equivalent to a half of the clock pulse period;
    a CMI/NRZ decoding means, connected to the clock pulse generating means and the falling transition detecting and 3-step half-period shifting means, for decoding the CMI data to the NRZ data, and
    a code violation detecting means for detecting code violation in the CMI data, which is connected to the clock pulse generating means, the reference pulse generating means, the rising transition detecting and 2-step half-period shifting means, and the falling transition detecting and 3-step half-period shifting means.

2. The apparatus according to claim 1, wherein the clock pulse generating means comprises an ECL(Emitter-Coupled Logic) receiver.

3. The apparatus according to claim 1, wherein the data output means comprises an ECL receiver.

4. The apparatus according to claim 1 wherein the inter-transitions time interval information output means 3 comprises:
    a first D-type flip-flop having a clock input to which non-inverting data from the ECL receiver is inputted and having a data input to which a logic level "1" is inputted;
    a second D-type flip-flop having a data input connected to the output of the first D-type flip-flop and having a clock input to which an in-phase clock pulse is inputted;
    a third D-type flip-flop having a data input coupled to the output of the first D-type flip-flop and having a clock input to which an inverse-phase clock pulse is inputted;
    a first OR gate having two inputs respectively coupled to the Q outputs of the second and third D-type flip-flops and having an output coupled to the clear inputs of the first, second and third D-type flip-flops;
    a fourth D-type flip-flop having a clock input to which the inverting data is inputted and having a D input to which a logic level "1" is inputted;
    a fifth D-type flip-flop having a D input connected to the Q output of the fourth D-type flip-flop and having a clock input to which the in-phase clock pulse is inputted;
    a sixth D-type flip-flop having a D input connected to the Q output of the fourth D-type flip-flop and having clock input to which the inverse-phase clock pulse is applied;
    a second OR gate having two inputs respectively coupled to Q outputs of the fifth and sixth flip-flops and having an output coupled to clear inputs of the fourth, fifth and sixth D-type flip-flops; and
    a third OR gate having two inputs to which output signals from the first and fourth D-type flip-flops are inputted respectively.

5. The apparatus according to claim 1 wherein the reference pulse generating means comprises:
    a first OR gate having an input to which an output signal of the inter-transitions time interval information output means is applied and having an input to which a feedback signal is applied, a first D-type flip-flop having a data input coupled to the output of the first OR gate and having a clock input to which the in-phase clock pulse is applied, a second D-type flip-flop having a data input coupled to the output of the first OR gate and having a clock input to which the inverse-phase clock pulse is applied; and an AND gate having two inputs coupled to the outputs of the first and second D-type flip-flops respectively and having an output coupled to the clear inputs of the first and second D-type flip-flops, and a second OR gate having two inputs coupled to the Q outputs of the first and second D-type flip-flops respectively and having an output connected to one of the inputs of the first OR gate.

6. The apparatus according to claim 1, wherein the rising transition detecting and 2-step half-period shifting means comprises first and second half-period shifting circuits and wherein the first half-period shifting circuit comprises:

a first OR gate having an input coupled to the output of the reference pulse generating means and having an input to which a feedback signal is applied, a first D-type flip-flop having a data input coupled to the output of the first OR gate and having a clock input to which the in-phase clock pulse is applied, a second D-type flip-flop having a data input coupled to the output of the reference pulse generating means and having a clock input to which the inverse-phase clock pulse is applied, a first AND gate having two inputs coupled to the Q outputs of the first and second D-type flip-flops respectively and having an output coupled to the clear inputs of the first and second D-type flip-flops; and a second OR gate having two inputs coupled to the Q outputs of the first and second D-type flip-flops and having an output coupled to the input of the first OR gate, and the second half-period shifting circuit comprises:

a third OR gate having an input coupled to the output of the second OR gate and having an input to which a feedback signal is applied, a third D-type flip-flop having a data input coupled to the output of the third OR gate and having a clock input to which the in-phase clock pulse is applied, a fourth D-type flip-flop having a data input coupled the output of the third OR gate and having a clock input to which the inverse-phase clock pulse is applied, a second AND gate having two inputs coupled to the outputs of the third and fourth D-type flip-flops respectively and having an output coupled to the clear inputs of the third and fourth D-type flip-flops, and a fourth OR gate having two inputs coupled to the outputs of the third and second D-type flip-flop respectively and having an output coupled to the input of the third OR gate.

7. The apparatus according to claim 1, wherein the falling transition detecting and 3-step half-period shifting means comprises; first, second and third half-period shifting circuits, and wherein the first half-period shifting circuit comprises:

a first OR gate having an input coupled to the output of the inter-transitions time interval information output means and having an input to which a feedback signal is applied, a first D-type flip-flop having a data input coupled to the output of the first OR gate and having a clock input to which the in-phase clock pulse is applied, a second D-type flip-flop having a data input coupled to the output of the first OR gate and having a clock input to which the inverse-phase clock pulse is applied, a first AND gate having two inputs coupled to the outputs of the first and second D-type flip-flops respectively and having an output coupled to the clear inputs of the first and second D-type flip-flops, and a second OR gate having two inputs coupled to the outputs of the first and second D-type flip-flops respectively and an output coupled to the input of the first OR gate, and the second half-period shifting circuit comprises:

a third OR gate having an input coupled to the output of the second OR gate and having an input to which a feedback signal is applied, a third D-type flip-flop having a data input coupled to the output of the third OR gate and having a clock input to which the in-phase clock pulse is applied, a fourth D-type flip-flop having a data input coupled to the output of the third OR gate and a clock input to which the inverse-phase clock pulse is applied, a second AND gate having two inputs coupled to the outputs of the third and fourth D-type flip-flops respectively and an output coupled to the clear inputs of the third and fourth D-type flip-flops, and a fourth OR gate having two inputs coupled to the output of the third and fourth D-type flip-flops respectively and an output coupled to the input of the third OR gate, and the third half-period shifting circuit comprises:

a fifth OR gate having an input coupled to the output of the fourth OR gate and having an input to which a feedback signal is applied, a fifth D-type flip-flop having a data input coupled to the output of the fifth OR gate and having a clock input to which the in-phase clock pulse is applied, a sixth D-type flip-flop having a data input coupled to the output of the fifth OR gate and a clock input to which the inverse-phase clock pulse is applied, a third AND gate having two inputs coupled to the outputs of the fifth and sixth D-type flip-flops respectively and an output coupled to the clear inputs of the fifth and sixth D-type flip-flops, and a sixth OR gate having two inputs coupled to the outputs of the fifth and sixth D-type flip-flops respectively and an output coupled to the input of the fifth OR gate.

8. The apparatus according to claim 1, wherein the CMI/NRZ decoding means comprises:

a first NOR gate having two inputs coupled to the output of the rising transition detecting and 2-step half-period shifting means and the output of the second half-period shifting circuit in falling transition detecting and 3-step half-period shifting means respectively, a second NOR gate having three inputs one of which being coupled to the output of the rising transition detecting and 2-step half-period shifting means and remaining two inputs being coupled to the outputs of the fast and second half-period shifting circuits in the falling transition detecting and 3-step half-period shifting means respectively, a OR gate having two inputs coupled to the outputs of the first and second NOR gate respectively, a first D-type flip-flop having a data input coupled to the output of the OR gate and having a clock input coupled to which the in-phase clock pulse is applied, a second D-type flip-flop having a data input coupled to the output of the OR gate and having a clock input to which the inverse-phase clock pulse is applied, a third NOR gate having two inputs coupled to the outputs of the first and second D-type flip-flop respectively, and a third D-type flip-flop having a data input coupled to the output of the third NOR gate and having a clock input to which the in-phase clock pulse is applied.

9. The apparatus according to claim 1 wherein the code violation detecting means comprises:

a NOR gate having an input coupled to the output of the reference pulse generating means and having two inputs coupled to the two outputs of the rising tiansition detecting and 2-step half-period shifting means respectively, and also having three inputs coupled to the three outputs of the falling transition detecting and 3-step half-period shifting means respectively, a first D-type flip-flop having a data input coupled to the output of the NOR gate and having a clock input to which the in-phase clock pulse is applied, a second D-type flip-flop having a data input coupled to the output of the NOR gate and having a clock input to which the inverse-phase clock pulse is applied, a OR gate having two inputs coupled to the outputs of the first and second D-type flip-flop respectively, and a third D-type flip-flop having a data input coupled to the output of the OR gate and having a clock input to which the in-phase clock pulse is applied.

* * * * *

UNITED STATES PATENT AND TRADEMARK OFFICE
CERTIFICATE OF CORRECTION

PATENT NO.   : 5,248,969
DATED        : September 28, 1993
INVENTOR(S)  : Lee et al.

It is certified that error appears in the above-identified patent and that said Letters Patent is hereby corrected as shown below:

In column 5 at line 56 change "cleat" to --clear--.

In column 11 at line 36 change "B00" to --800--.

Signed and Sealed this

Sixth Day of June, 1995

Attest:

BRUCE LEHMAN

*Attesting Officer*       *Commissioner of Patents and Trademarks*